(12) United States Patent
Lo et al.

(10) Patent No.: US 8,546,169 B1
(45) Date of Patent: Oct. 1, 2013

(54) PRESSURE SENSOR DEVICE AND METHOD OF ASSEMBLING SAME

(75) Inventors: Wai Yew Lo, Petaling Jaya (MY); Fui Yee Lim, Kepong (MY)

(73) Assignee: Freescale Semiconductor, Inc., Austin, TX (US)

( * ) Notice: Subject to any disclaimer, the term of this patent is extended or adjusted under 35 U.S.C. 154(b) by 13 days.

(21) Appl. No.: 13/455,154

(22) Filed: Apr. 25, 2012

(51) Int. Cl.
*H01L 21/00* (2006.01)

(52) U.S. Cl.
USPC .............................................. 438/50; 438/51

(58) Field of Classification Search
USPC ..................................................... 438/50, 51
See application file for complete search history.

(56) References Cited

U.S. PATENT DOCUMENTS

| | | | |
|---|---|---|---|
| 4,259,436 A | 3/1981 | Tabuchi | |
| 6,100,112 A | 8/2000 | Amano | |
| 6,306,685 B1 | 10/2001 | Liu | |
| 7,473,586 B1 | 1/2009 | Lo | |
| 7,671,432 B2 * | 3/2010 | Fujii | ............................. 257/419 |
| 8,124,459 B2 | 2/2012 | Yoon | |
| 2013/0126988 A1 * | 5/2013 | Lo | ................................. 257/415 |

\* cited by examiner

*Primary Examiner* — Ngan Ngo
(74) *Attorney, Agent, or Firm* — Charles Bergere

(57) ABSTRACT

A pressure sensor device is assembled by forming cavities on a surface of a metal sheet and then forming an electrically conductive pattern having traces and bumps over the cavities. An insulating layer is formed on top of the pattern and then processed to form exposed areas and die attach areas on the surface of the metal sheet. The exposed areas are plated with a conductive metal and then electrically connected to respective ones of the bumps. A gel is dispensed on the die attach areas and sensor dies are attached to respective die attach areas. One or more additional semiconductor dies are attached to the insulating layer and bond pads of these dies are electrically connected to the exposed plated areas. A molding compound is dispensed such that it covers the sensor die and the additional dies. The metal sheet is removed to expose outer surfaces of the bumps.

10 Claims, 4 Drawing Sheets

PRESSURE SENSOR DEVICE AND METHOD OF ASSEMBLING SAME

BACKGROUND OF THE INVENTION

The present invention relates generally to pressure sensor devices, and more particularly to a bumped chip carrier type pressure sensor device.

Modern electrical and electronic devices such as mobile phones, digital cameras and sensors require smaller and smaller integrated circuits. Packaging techniques have been developed to meet these requirements. Leaded bumped chip carrier (BCC) technology produces a chip scale lead frame based molded package with bumps, which are formed after the lead frame is etched away. However, existing BCC packages are peripheral non-pressure sensor wire bond types of packages. Moreover, existing pressure sensor packaging techniques are expensive and have certain reliability issues.

Accordingly, it would be advantageous to have a more reliable and economical way to package semiconductor pressure sensor dies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 2 is a side cross-sectional view showing a carrier with a photolithographic material applied to a first surface of a metal sheet;

FIG. 3 is an illustration of a step of forming a photolithographic material pattern on the metal sheet of FIG. 2;

FIG. 4 is an illustration of a step of forming a plurality of cavities on the metal sheet;

FIG. 5 shows a step of removing the photolithographic material from the metal sheet;

FIG. 6 is a side cross-sectional view showing the metal sheet with cavities plated with a trace metal;

FIG. 7 is an illustration of a step of forming an electrically insulating layer on the metal sheet;

FIG. 8 is an illustration of a step of forming exposed areas on the first surface of the metal sheet;

FIG. 9 is an illustration of a step of plating the exposed areas formed on the metal sheet;

FIG. 10 is an illustration of a step of forming die attach areas on the metal sheet;

FIG. 11 is an illustration of a step of dispensing a gel material into the die attach areas;

FIG. 12 is an illustration of a step of attaching semiconductor sensor dies to respective die attach areas of the metal sheet;

FIG. 13 is an illustration of a step of dispensing the gel material on the pressure sensor dies;

FIG. 14 shows the step of attaching one or more additional semiconductor dies to the electrically insulating layer;

FIG. 15 shows the step of electrically connecting the additional semiconductor dies to the carrier;

FIG. 16 shows the step of dispensing a molding compound onto the metal sheet;

FIG. 17 shows the step of removing the metal sheet from the packaged sensor device; and FIG. 18 illustrates a step of separating assembled pressure sensor devices from adjacent pressure sensor devices.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of forming a pressure sensor package. A metal sheet is provided and a plurality of cavities is formed on a first surface of the metal sheet. An electrically conductive pattern is formed on the metal sheet and over the plurality of cavities. The electrically conductive pattern includes traces and electrically conductive bumps. An electrically insulating layer is formed on the first surface of the electrically conductive pattern and the electrically insulating layer is processed to form exposed areas and die attach areas on the first surface of the metal sheet. The exposed areas are plated with a conductive metal. The exposed plated areas are electrically connected to respective ones of the electrically conductive bumps. A gel material is dispensed on the die attach areas. Pressure sensor dies are attached to respective die attach areas. One or more additional semiconductor dies are attached to the electrically insulating layer and bond pads of the semiconductor dies are electrically connected to the exposed plated areas. A molding compound is dispensed onto the first surface of the metal sheet such that the molding compound covers the pressure sensor die and the one or more additional semiconductor dies and the metal sheet is removed such that outer surfaces of the electrically conductive bumps are exposed.

In yet another embodiment, the present invention is a pressure sensor device packaged in accordance with the above-described methods.

Figure 1:
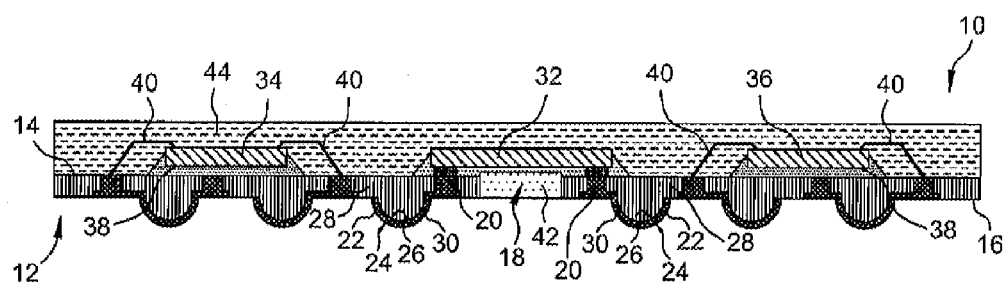
FIG. 1 is a cross-sectional view of a pressure sensor device in accordance with one embodiment of the present invention.

Referring now to FIG. 1, a cross-sectional view of a pressure sensor device 10 in accordance with an embodiment of the present invention is shown. The pressure sensor device 10 includes a carrier 12 having a first surface 14 and a second surface 16.

The first surface 14 of the carrier 12 includes a die attach area 18 and a plurality of bond pads 20. The bond pads 20 are formed of a conductive metal, such as gold. The second surface 16 of the carrier 12 includes a plurality of electrically conductive bumps 22 integral with the carrier 12. In the illustrated embodiment, an outer surface 24 of each of the electrically conductive bumps 22 is exposed. The electrically conductive bumps 22 include filled cavities 26 having an electrically insulating layer 28 plated with a conductive metal 30. In one embodiment, the electrically insulating layer 28 includes a solder resist film. The plated metal 30 may include gold, nickel, copper, or the like.

A semiconductor sensor die 32 is attached and electrically coupled to the carrier 12 at the die attach area 18. In this exemplary embodiment of the invention, the semiconductor sensor die 32 is a piezo resistive transducer (PRT) die. The semiconductor sensor die 32 may be attached to the carrier 12 in a number of ways, such as by gold studs, or gold or copper pillars, or solder, which can be either lead free solder or solder formed with lead. The techniques for attaching the die 32 to the die attach area 18 are generally known in the art and thus detailed descriptions thereof are not necessary for a complete understanding of the present invention.

In certain exemplary embodiments, one or more additional semiconductor dies 34, 36 may be attached and electrically coupled to the carrier 12. The additional dies may include a microcontroller (MCU), application specific integrated circuit (ASIC), and other types of sensors. In the embodiment shown, the additional dies comprise a MCU die and a G-cell die. The additional semiconductor dies 34, 36 may be attached to the carrier with a die attach adhesive 38 such as epoxy, as is known in the art.

In this exemplary embodiment of the invention, the semiconductor dies 34 and 36 are attached and electrically coupled to the respective bond pads 20 of the carrier 12 with bond wires 40. The wires 40 are bonded to respective bond pads of the semiconductor dies 34 and 36 and to corresponding bond ponds of the carrier 12 using known wire bonding processes and known wire bonding equipment. The wires 40 are formed from a conductive material such as aluminum, copper or gold. Also, if the PRT die 32 has bonding pads on its top surface then such bonding pads may be electrically connected to bonding pads of the additional dies 34, 36 with wires, either directly or by way of an intermediate carrier bonding pad.

Another way of electrically connecting the additional semiconductor dies 34 and 36 to the carrier 12 is to connect bond pads of the semiconductor dies 34 and 36 to the respective bond pads 20 of the carrier 12 with flip-chip bumps (not shown) attached to an underside of the respective dies. The flip-chip bumps may include solder bumps, gold balls, molded studs, or combinations thereof.

A gel material 42 such as a silicon-based gel is deposited within the die attach area 18, and preferably around the perimeter of the active side of the die. A molding compound 44 covers the PRT die 32, the additional semiconductor dies 34 and 36 and the electrical connections 40 between the semiconductor dies 32, 34 and 36 and the carrier 12. The molding compound 44 may include plastic or an epoxy molding compound, as is known in the art.

Existing bump chip carrier (BCC) packages are peripheral non-pressure sensor wire bond packages. The present invention provides a method of assembling a BCC pressure sensor device with the following advantages. The pressure sensor device 10 assembled in accordance with the present invention has pre-formed exposed conductive bumps that are integral with the carrier 12. Thus, an array, high density, pressure sensor package is provided. This is possible by re-routing traces and using a build-up process to construct the package. The final, packaged device has pre-formed exposed bumps similar to current solder ball interconnections (C5 bumps). Since the C5 bumps are formed as part of the assembly process, there is no need for additional C5 solder ball attach at the assembly backend. Since the C5 bumps are part of the overall package structure, this will help to eliminate solder ball drop issues. The insulation film 28 on the C5 bumps provides stress relief, which reduces direct stress impact on the joint during thermal cycling after the device 10 is attached to a printed circuit board. This is useful if the device 10 includes an accelerometer die, to reduce signal shift problems. The solder mask also acts as a stress relief and strain absorption layer during electrical testing via the C5 bumps. That is, the solder mask layer helps to reduce impact force from the test socket. The present invention also introduces assembly cost reduction steps since there is no need for a metal lid or a pre-molded lead frame.

Figure 2:
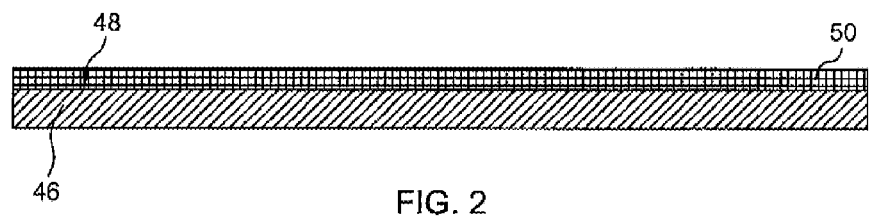
FIGS. 2-18 are side cross-sectional views illustrating various steps for assembling the pressure sensor device shown in FIG. 1, where

Referring now to FIGS. 2-18, a method of assembling a pressure sensor device in accordance with an embodiment of the invention will be described. FIG. 2 is a side cross-sectional view showing a metal sheet 46 with a photolithographic material 50 applied to a first surface 48 of the metal sheet 46. The metal sheet 46 may be a conductive metal sheet such as copper foil or a copper sheet. In this embodiment, the metal sheet 46 is generally rectangular in shape. However, other suitable shapes may be envisaged. In this embodiment, a thickness of the copper sheet is about 0.5 mm. The photolithographic material 50 may include a resist coating or a dry film lamination.

Figure 3:
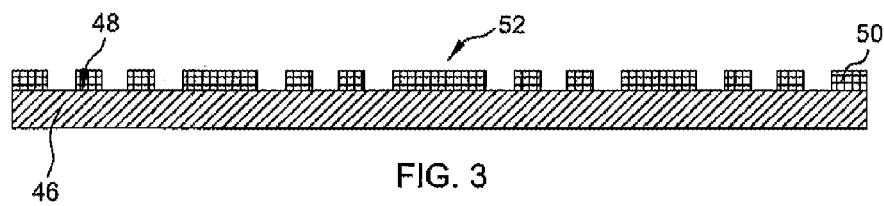
Figure 4:
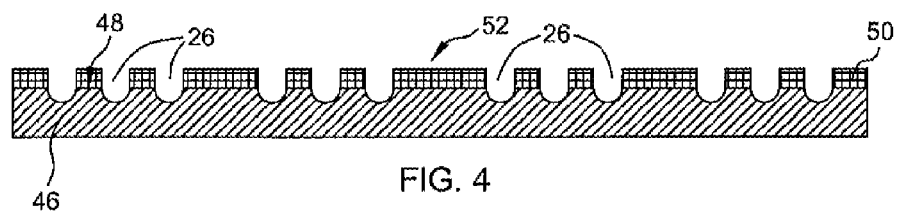

FIG. 3 is an illustration of a step of forming a photolithographic material pattern on the carrier 12. In this exemplary embodiment, the photolithographic material 50 and the metal sheet 46 are exposed and developed or otherwise processed to form a predetermined pattern 52 on the first surface 48 of the metal sheet 46. The metal sheet 46 is then etched to form a plurality of the cavities 26 on the first surface 48 of the metal sheet 46, as illustrated in FIG. 4.

Figure 5:
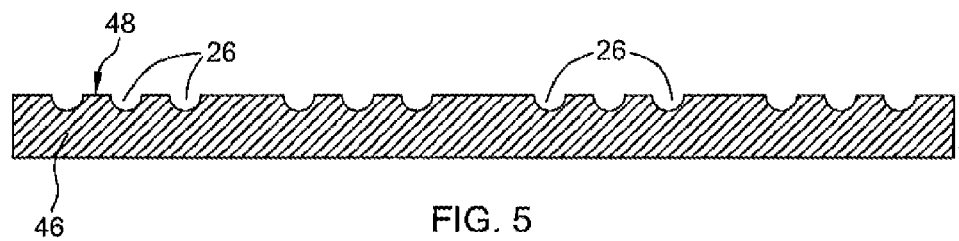

As can be seen, the cavities 26 extend through the photolithographic material 50 and into the metal sheet 46. The etching of the metal sheet 46 may be performed using an acid bath in which the non-coated areas of the metal sheet 46 are etched. The photolithographic material 50 is subsequently removed or stripped as illustrated in FIG. 5. The photolithographic material 50 may be removed manually or with a machine, as is known in the art.

Figure 6:
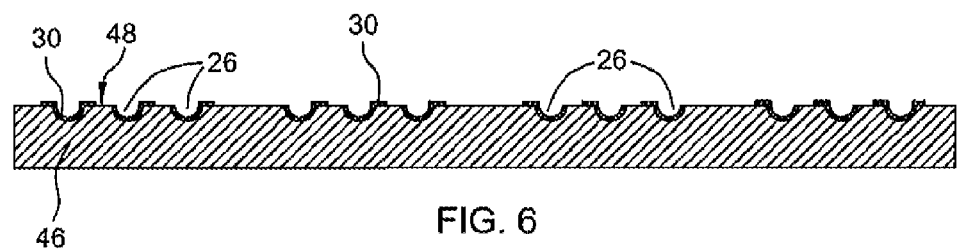

FIG. 6 is a side cross-sectional view showing the metal sheet 48 with cavities 26 plated with a conductive metal 30. In the illustrated embodiment, the cavities 26 are electroplated with a conductive metal 30 to form electrical interconnects. The conductive metal 30 may be gold, nickel, copper or the like.

Figure 7:
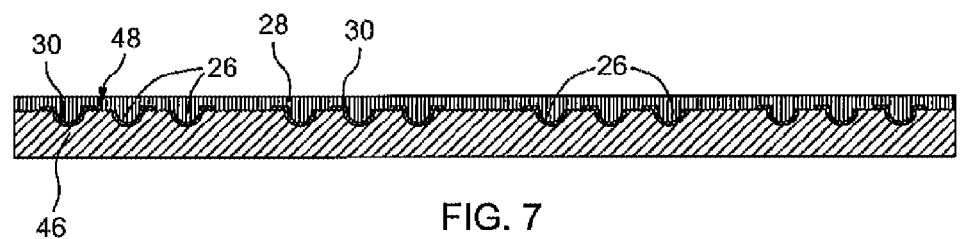
Figure 8:
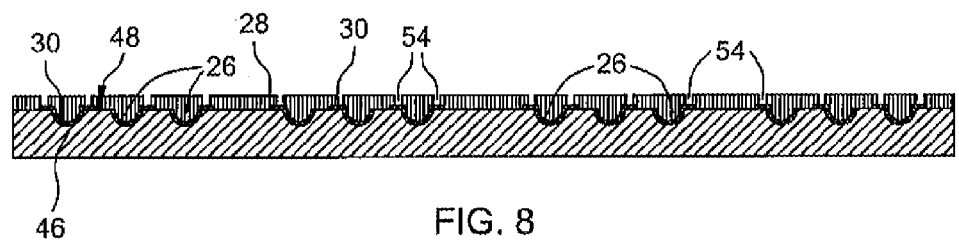
Figure 9:
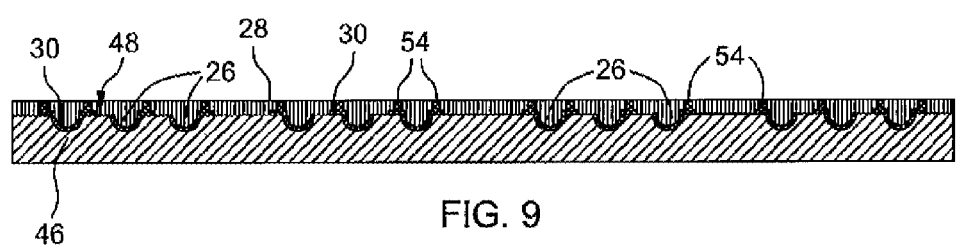

FIG. 7 is an illustration of a step of forming an electrically insulating layer 28 on the metal sheet 46. In this embodiment, the electrically insulating layer 28 includes a solder resist film that is laminated over the metal sheet 46 and the plated cavities 26. The laminated film is subsequently exposed and developed and thermally cured to form exposed areas such as represented by reference numeral 54 on the first surface 48 of the metal sheet 46, as illustrated in FIG. 8. In certain embodiments, the exposed areas are formed using a laser, as is known in the art. Further, the exposed areas 54 are plated with the conductive metal 30, as illustrated in FIG. 9.

Figure 10:
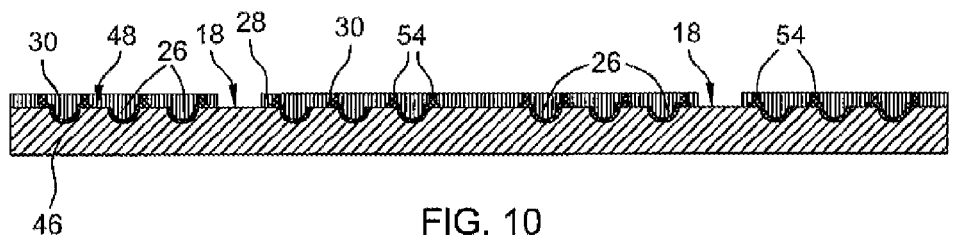

FIG. 10 is an illustration of a step of forming die attach areas 18 on the first surface 48 of the metal sheet 46. In this embodiment, the electrically insulating layer 28 is subjected to exposure, development and thermal cure using a mask and photo imaging to form the die attach areas 18. The die attach areas 18 are formed to receive pressure sensor dies, as will be described below.

Figure 11:
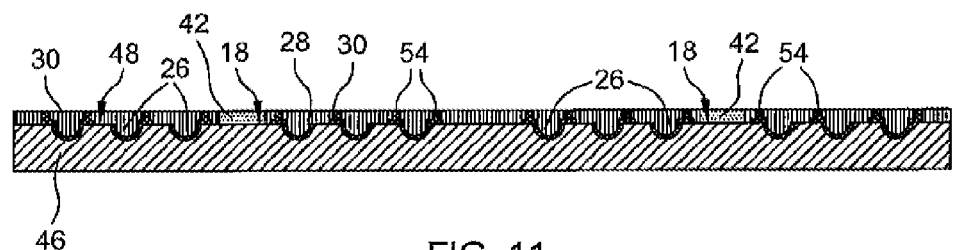

FIG. 11 shows the step of dispensing a gel material 42 on the die attach areas 18. The gel material 42, which may be a silicon-based gel, is dispensed into the die attach areas 18 and is subsequently cured. The gel material 42 may be dispensed with a nozzle of a conventional dispensing machine, as is known in the art or by screen printing.

Figure 12:
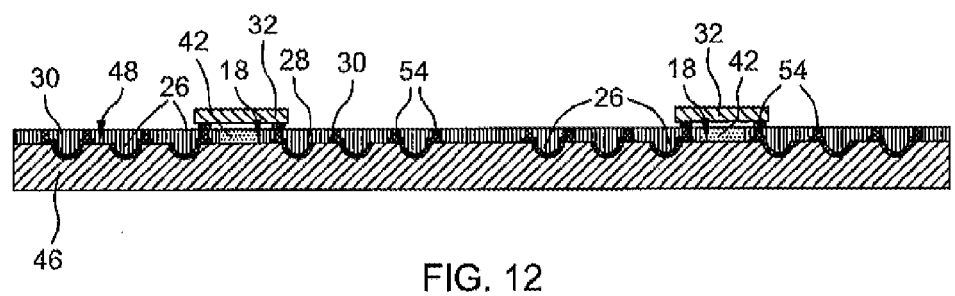
Figure 13:
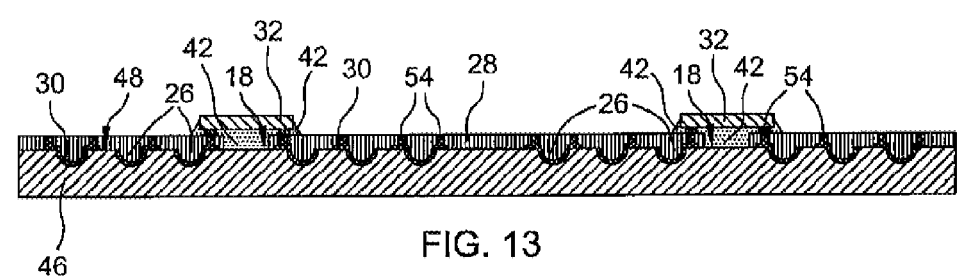

FIG. 12 is an illustration of a step of attaching semiconductor sensor dies 32 to respective die attach areas 18. The semiconductor sensor dies 32 are attached to respective die attach areas 18 through die bumps such as gold studs, gold or copper pillars, or leaded or lead free solder. In this exemplary embodiment of the invention, the semiconductor sensor die 32 is a PRT die. Additional gel material 42 now is dispensed to cover the PRT die 32, as illustrated in FIG. 13, and subsequently cured. The additional gel material 42 is dispensed along the perimeter of the PRT die 32, like an underfill material used in conventional semiconductor assembly. It is preferred to have the gel material 42 cover the active side of the die 32 so that the mold compound (discussed below and shown in FIG. 16) will not flow beneath the die 32 and cover the active side of the die 32. If the mold compound covers the active side of the pressure sensor die 32, the die 32 will not be able to sense the external pressure environment. The additional gel material 42 is applied at the perimeter of the die 32 and via capillary effect, the gel material 42 flows and coats completely the active side of the pressure sensor die 32. The side walls of the pressure sensor die 32 also will be at least partially coated with the gel material 42, forming a fillet around the die 32. The additional gel material subsequently is cured. Although gel material 42 is applied in two steps, as discussed above, a single gel material coating step could be performed after the die attach step. However, at present, it is believed that applying the gel material 42 in a single step, after die attach, may not sufficiently fill the cavity since the capillary effect may not be effective in completely filling a large cavity.

Figure 14:
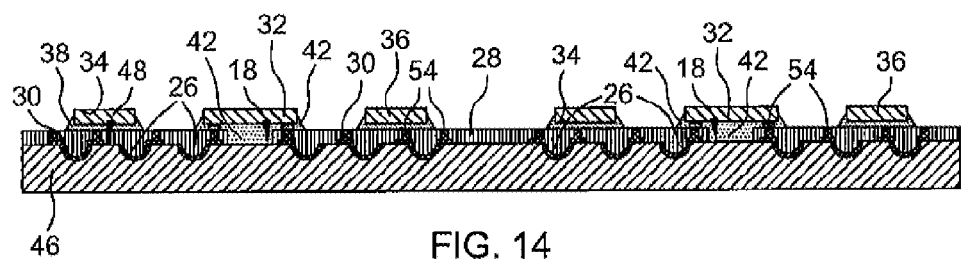

FIG. 14 shows the step of attaching one or more additional semiconductor dies 34 and 36 to the electrically insulating layer 28. The additional semiconductor dies 34 and 36 may include a microcontroller (MCU), other types of sensors such as a G-cell, and other integrated circuits such as an Application Specific IC (ASIC). The ASIC may be either a digital circuit, an analog circuit, or an analog-mixed signal circuit. The additional semiconductor dies 34 and 36 may be attached to the electrically insulating layer 28 by a die-attach adhesive 38 such as epoxy as is known in the art.

Figure 15:
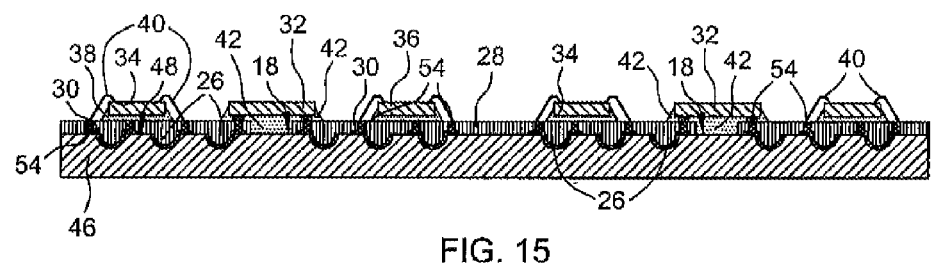

FIG. 15 shows the step of electrically connecting the additional semiconductor dies 34 and 36 to the exposed plated areas 54. In this exemplary embodiment of the invention, bond pads of the additional semiconductor dies 34 and 36 are electrically connected to the exposed plated areas 54 with the wires 40 using a well known wire bonding process and known wire bonding equipment. Although not shown, the PRT die 32 also could be directly connected with either or both of the additional dies using bond wires and a wire bonding process.

Another way of connecting the semiconductor dies 34 and 36 is through flip-chip bumps (not shown) attached to an underside of the semiconductor dies 34 and 36. The flip-chip bumps may include solder bumps, gold balls, molded studs, or combinations thereof. The bumps may be formed or placed on the semiconductor dies 34 and 36 using known techniques such as evaporation, electroplating, printing, jetting, stud bumping and direct placement.

Figure 16:
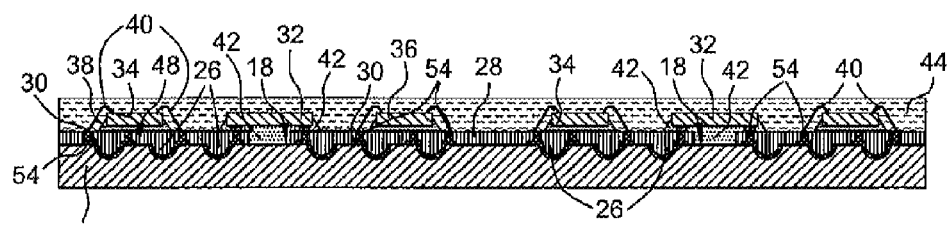

FIG. 16 shows the step of dispensing a molding compound 44 such as epoxy onto the first surface 48 of the metal sheet 46. The molding compound 44 covers the semiconductor sensor die 32, the one or more additional semiconductors 34 and 36 and the electrical connections thereto. One way of dispensing the molding compound over the metal sheet 46 is using a nozzle of a conventional dispensing machine, as is known in the art.

Alternatively, the molding compound 44 may include a silica-filled resin, a ceramic, a halide-free material, the like, or combinations of the above. The molding compound 44 is typically applied using a liquid, which is then heated to form a solid by curing in a UV or ambient atmosphere. The molding compound 44 can also be a solid that is heated to form a liquid and then cooled to form a solid mold. In alternative embodiments, other encapsulating processes may be used. Subsequently, an oven is used to cure the molding compound 44.

Figure 17:
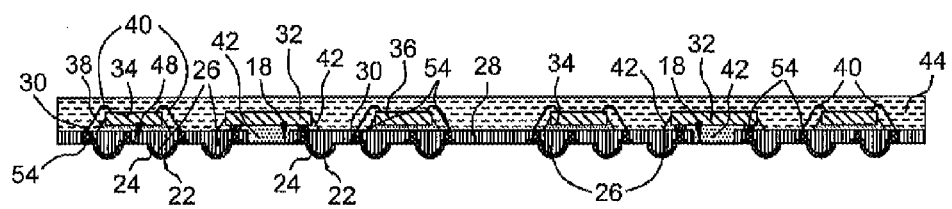

FIG. 17 shows the step of removing the metal sheet 46. In one embodiment, the metal sheet 46 is removed using wet chemical etching done in a solution that dissolves the metal sheet 46 such that the outer surfaces 24 of the electrically conductive bumps 22 are exposed.

Figure 18:
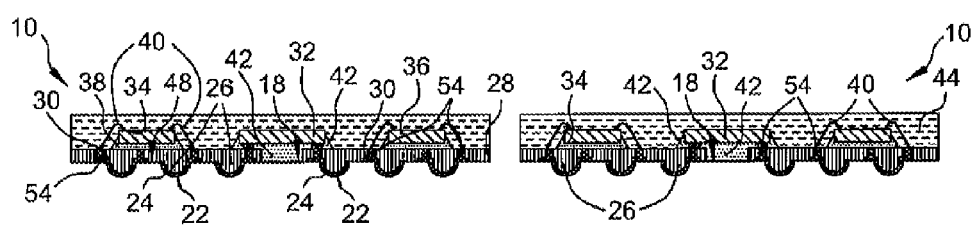

FIG. 18 shows the individual pressure sensor devices 10 being separated from each other by a singulation process. Singulation processes are well known and may include cutting with a saw or a laser to form the individual packaged sensor devices 10.

The present invention, as described above, allows for forming a high density pressure sensor package with preformed exposed conductive bumps similar to existing packages with solder ball interconnections. The pressure sensor devices formed by the present technique includes integrated bumps and thus does not require additional C5 solder ball attach at the assembly backend. Moreover, the integral conductive bumps eliminate any possible solder drop issues.

Thus, the present invention provides a method of packaging semiconductor sensor dies such as a pressure sensor die to form chip carrier packages with integral C5 bumps. Such pressure sensor packaging may be utilized for a variety of applications such as air pressure sensing applications. The package formed using the technique described above includes an insulating layer on the C5 bumps that reduces the direct stress impact on the joint during thermal cycling after attaching to an external board. In particular, this feature is advantageous if the package has an accelerometer die to reduce the signal shift problem.

By now it should be appreciated that there has been provided an improved packaged semiconductor sensor device and a method of forming the packaged semiconductor sensor device. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of assembling a pressure sensor device, comprising the steps of:
   providing a metal sheet;
   forming a plurality of cavities on a first surface of the metal sheet;
   forming an electrically conductive pattern on the metal sheet and over the plurality of cavities, wherein the electrically conductive pattern comprises traces and electrically conductive bumps;
   forming an electrically insulating layer on the first surface and the electrically conductive pattern;
   processing the electrically insulating layer to form exposed areas and die attach areas on the first surface of the metal sheet and plating the exposed areas with a conductive metal, wherein exposed plated areas are electrically connected to respective ones of the electrically conductive bumps;
   dispensing a gel material on the die attach areas;
   attaching pressure sensor dies to respective die attach areas;
   attaching one or more additional semiconductor dies to the electrically insulating layer and electrically connecting bond pads of the additional semiconductor dies to the exposed plated areas;
   dispensing a molding compound onto the first surface of the metal sheet such that the molding compound covers the pressure sensor die and the one or more additional semiconductor dies; and
   removing the metal sheet such that outer surfaces of the electrically conductive bumps are exposed.

2. The method of assembling a pressure sensor device of claim 1, wherein the metal sheet comprises copper.

3. The method of assembling a pressure sensor device of claim 1, wherein forming the electrically conductive pattern comprises depositing a trace metal on the metal sheet and within the cavities.

4. The method of assembling a pressure sensor device of claim 1, wherein the electrically insulating layer comprises a solder resist film.

5. The method of assembling a pressure sensor device of claim 1, wherein the pressure sensor die comprises a bumped die and die bumps of the pressure sensor die are attached to respective exposed plated areas.

6. The method of assembling a pressure sensor device of claim 1, wherein the pressure sensor dies comprises piezo resistive transducer (PRT) semiconductor dies.

7. The method of assembling a pressure sensor device of claim 1, wherein the bond pads of the additional semiconductor dies are electrically connected to the exposed plated areas with wires using a wire bonding process.

8. The method of assembling a pressure sensor device of claim 1, wherein removing the metal sheet comprises etching the metal sheet using a chemical etching process.

9. The method of assembling a pressure sensor device of claim 1, wherein the one or more additional semiconductor dies comprises an MCU and a G-cell sensor.

10. A method of assembling a pressure sensor device, comprising the steps of:
    providing a metal sheet;
    forming a plurality of cavities on a first surface of the metal sheet;
    depositing a trace metal on the metal sheet and within the cavities to form a plurality of conductive bumps on the metal sheet;
    forming a solder resist film on the first surface of the metal sheet such that the solder resist film covers the cavities;
    processing the solder resist film to form exposed areas on the first surface of the metal sheet; plating the exposed areas with a conductive metal;
    forming a plurality of die attach areas on the first surface of the metal sheet;
    dispensing a gel material into the die attach areas;
    attaching pressure sensor dies to respective die attach areas of the metal sheet and covering the pressure sensor semiconductor dies with the gel material;
    attaching one or more semiconductor dies to the solder resist film and electrically connecting bond pads of the semiconductor dies to exposed plated areas of the metal sheet;
    dispensing a molding compound onto the first surface of the metal sheet such that the molding compound covers the pressure sensor die and the one or more semiconductor dies;
    removing the metal sheet such that outer surfaces of the conductive bumps are exposed; and
    singulating the metal sheet to form individual packaged semiconductor sensor devices.

* * * * *